United States Patent
Vellianitis et al.

(10) Patent No.: US 11,450,748 B2
(45) Date of Patent: Sep. 20, 2022

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Georgios Vellianitis, Heverlee (BE); Gerben Doornbos, Kessel-Lo (BE); Marcus Johannes Henricus Van Dal, Linden (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/088,601

(22) Filed: Nov. 4, 2020

(65) Prior Publication Data
US 2021/0376089 A1 Dec. 2, 2021

Related U.S. Application Data
(60) Provisional application No. 63/031,001, filed on May 28, 2020.

(51) Int. Cl.
*H01L 29/22* (2006.01)
*H01L 29/78* (2006.01)
(52) U.S. Cl.
CPC .............. *H01L 29/22* (2013.01); *H01L 29/78* (2013.01)
(58) Field of Classification Search
CPC ................................ H01L 29/22; H01L 29/78

USPC ............................................................. 257/43
See application file for complete search history.

(56) References Cited

U.S. PATENT DOCUMENTS

| | | | |
|---|---|---|---|
| 2009/0278236 A1* | 11/2009 | Sato | H01L 29/78 257/620 |
| 2010/0181565 A1* | 7/2010 | Sakata | H01L 21/02631 257/E29.296 |
| 2012/0187395 A1 | 7/2012 | Koezuka | |
| 2013/0196469 A1 | 8/2013 | Facchetti et al. | |
| 2014/0332802 A1* | 11/2014 | Ohnuki | G11C 16/0433 257/43 |
| 2017/0194502 A1 | 7/2017 | Baeck | |
| 2019/0245090 A1 | 8/2019 | Kusayanagi et al. | |

FOREIGN PATENT DOCUMENTS

| | | |
|---|---|---|
| CN | 107302027 | 10/2017 |
| JP | 2018157210 | 10/2018 |
| KR | 20090129513 | 12/2009 |

(Continued)

OTHER PUBLICATIONS

"Office Action of Taiwan Counterpart Application", dated Nov. 26, 2021, p. 1-p. 5.

(Continued)

*Primary Examiner* — Monica D Harrison
(74) *Attorney, Agent, or Firm* — JCIPRNET

(57) ABSTRACT

A semiconductor device and a manufacturing method thereof are provided. The semiconductor device has a semiconductor layer and a gate structure located on the semiconductor layer. The semiconductor device has source and drain terminals disposed on the semiconductor layer, and a binary oxide layer located between the semiconductor layer and the source and drain terminals.

20 Claims, 13 Drawing Sheets

(56) References Cited

FOREIGN PATENT DOCUMENTS

| KR | 20170080320 | 7/2017 |
| KR | 20190027913 | 3/2019 |
| WO | 2008126878 | 10/2008 |

OTHER PUBLICATIONS

Office Action of Korean Counterpart Application, dated Mar. 8, 2022, pp. 1-6.

\* cited by examiner

SEMICONDUCTOR DEVICE AND MANUFACTURING METHOD THEREOF

CROSS-REFERENCE TO RELATED APPLICATION

This application claims the priority benefit of U.S. provisional application Ser. No. 63/031,001, filed on May 28, 2020. The entirety of the above-mentioned patent application is hereby incorporated by reference herein and made a part of this specification.

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
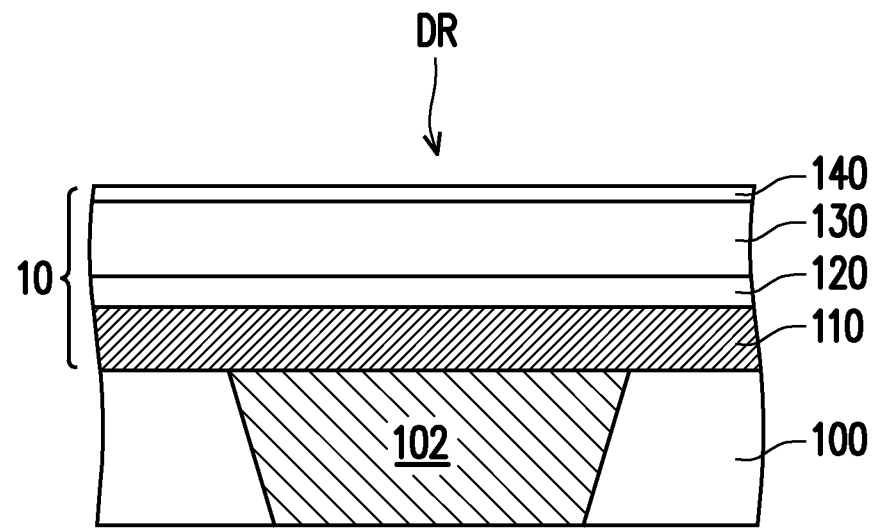
FIG. 1 to FIG. 6 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and other semiconductor devices. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

Figure 9:
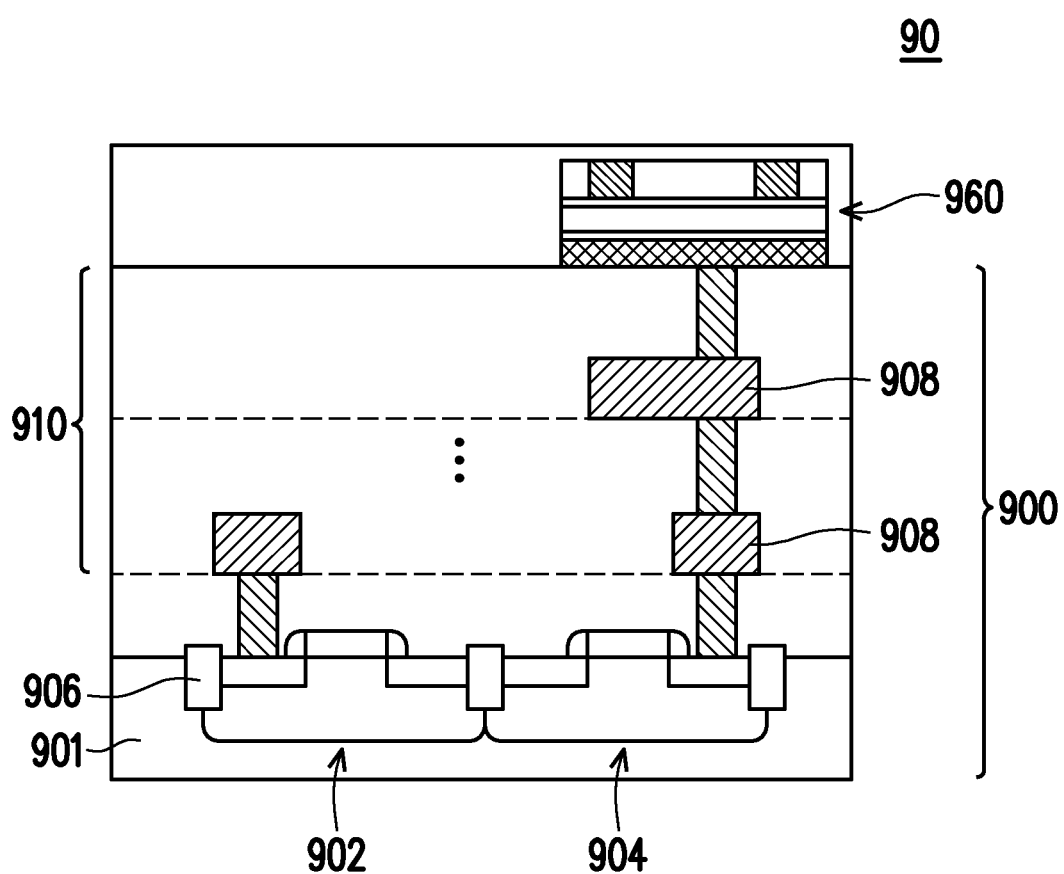
FIG. 9 is a schematic cross-sectional view showing a portion of the structure and a semiconductor device therein in accordance with some embodiments of the disclosure.

FIG. 1 through FIG. 6 are schematic cross-sectional views of various stages in a manufacturing method of a semiconductor device in accordance with some embodiments of the disclosure. From FIG. 1 through FIG. 6, schematic cross-section views of a device region DR of the integration structure are shown. FIG. 9 is a schematic cross-sectional view showing a portion of the structure and a semiconductor device therein in accordance with some embodiments of the disclosure.

Referring to FIG. 1, in some embodiments, a substrate 100 having one or more connection structure 102 therein is provided. As shown in FIG. 1, in some embodiments, the connection structure 102 (only one is shown) is formed in the substrate 100 within the device region DR. It is understood that the number of the connection structure 102 may be more than one, and the number or the configuration of the connection structure 102 should not be limited by the exemplary embodiments or drawings of this disclosure. In FIGS. 1-6, only a portion of the device region DR of the substrate 100 is shown for illustration purposes. In some embodiments, the substrate 100 also includes one or more active component such as transistors, diodes, optoelectronic devices and/or one or more passive components such as capacitors, inductors and resistors. Referring to FIG. 9, the integration structure 90 includes a substrate 900 and a semiconductor device 960 formed over the substrate 900. In some embodiments, the substrate 900 is substantially similar to the substrate 100 of FIG. 1.

Referring to FIG. 1 and FIG. 9, in some embodiments, either the substrate 100 or the substrate 900 includes a semiconductor substrate. In one embodiment, the substrate 100 or 900 comprises a crystalline silicon substrate or a doped semiconductor substrate (e.g., p-type semiconductor substrate or n-type semiconductor substrate). In certain embodiments, the substrate 100 or 900 comprises one or more doped regions or various types of doped regions, depending on design requirements. In some embodiments, the doped regions are doped with p-type and/or n-type dopants. For example, the p-type dopants are boron or BF2 and the n-type dopants are phosphorus or arsenic. The doped regions may be configured for an n-type metal-oxide-semiconductor (MOS) transistor or a p-type MOS (PMOS) transistor. In some alternative embodiments, the substrate 100 or 900 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, as shown in FIG. 9, the substrate 900 includes transistors such as a NMOS 902 and a PMOS 904 formed in the semiconductor substrate 901. In one embodiment, the NMOS 902 and/or the PMOS 904 are formed following the complementary MOS (CMOS) processes. As shown in FIG. 9, in some embodiments, more than one isolation structures 906 are formed in the semiconductor substrate 901. In certain embodiments, the isolation structures 906 are trench isolation structures. In other embodiments, the isolation structures 906 includes local oxidation of silicon (LOCOS) structures. In some embodiments, the insulator material of the isolation structures 906 includes silicon oxide, silicon nitride, silicon oxynitride, a spin-on dielectric material, or a low-k dielectric material. In one embodiment, the insulator material may be formed by CVD such as high-density-plasma chemical vapor deposition (HDP-CVD) and sub-atmospheric CVD (SACVD) or formed by spin-on. In certain embodiments, the transistors such as the NMOS 902 and the PMOS 904 and the isolation structures 906 are formed in the substrate 900 during the front-end-of-line (FEOL) processes.

In some embodiments, the substrate 900 includes metallization structures 908 embedded in an insulation layer 910. As shown in FIG. 9, the insulation layer 910 and the metallization structures 908 are located over the transistors formed in the semiconductor substrate 901. In some embodiments, the insulation layer 910 includes one or more dielectric layers. In some embodiments, a material of the insulation layer 910 includes silicon oxide, a spin-on dielectric material, a low-k dielectric material or a combination thereof. The formation of the insulation layer 910 includes performing one or more processes by chemical vapor deposition (CVD) or by spin-on, for example. In some embodiments, the metallization structures 908 include interconnect structures, such as metal lines, via and contact plugs. In certain embodiments, the materials of the metallization structures 908 include aluminum (Al), aluminum alloys, copper (Cu), copper alloys, tungsten (W), or combinations thereof. In exemplary embodiments, the transistors such as the NMOS 902 and the PMOS 904 are electrically connected with the metallization structures 908, and some of the transistors are further electrically interconnected through the metallization structures 908. The metallization structures 908 shown herein are merely for illustrative purposes, and the metallization structures 908 may include other configurations and may include one or more through vias and/or damascene structures.

Referring back to FIG. 1, in some embodiments, the connection structure 102 embedded in the substrate 100 may be a part of metallization structures in the substrate 100 for electrical connection and interconnection, and the metallization structures in the substrate 100 are similar to the metallization structures 908 as depicted in FIG. 9. In one embodiment, the connection structure 102 includes a conductive via. In FIG. 1, a gate material layer 110 is blanketly formed over the substrate 100 covering the connection structure. In one embodiment, the gate material layer 110 is in direct contact with the connection structure 102. In some embodiments, the gate material layer 110 includes one or more metallic material layers. In some embodiments, the formation of the gate material layer 110 includes one or more deposition processes selected from chemical vapor deposition (CVD) (such as, plasma enhanced CVD (PECVD) and laser-assisted CVD), atomic layer deposition (ALD), and physical vapor deposition (PVD) (such as, sputtering, and e-beam evaporation). In some embodiments, the formation of the gate material layer 110 includes a plating process. In some embodiments, the gate material layer 110 is formed with a thickness ranging from about 5 nm to about 100 nm. In some embodiments, the materials of the gate material layer 110 include aluminum (Al), titanium (Ti), tungsten (W), tantalum (Ta), nitride thereof, combinations thereof, and/or alloys thereof. For example, the gate material layer 110 may include one or more stacked layers of TiN, TaN, W/TiN, TiN/TiAl/TiN or TiN/TiAl/TaN.

In FIG. 1, in some embodiments, a gate dielectric material layer 120 is globally formed over the gate material layer 110. In some embodiments, the gate dielectric material layer 120 includes one or more high-k dielectric materials, such as $ZrO_2$, $Gd_2O_3$, $HfO_2$, $BaTiO_3$, $Al_2O_3$, $LaO_2$, $TiO_2$, $Ta2Os$, $Y_2O_3$, STO, BTO, BaZrO, HfZrO, HfLaO, HfTaO, HfTiO, or combinations thereof. In some embodiments, the gate dielectric material layer 120 includes one or more materials selected from aluminum oxide, hafnium oxide, tantalum oxide and zirconium oxide. In some embodiments, the formation of the gate dielectric material layer 120 includes one or more deposition processes selected from CVD (such as, PECVD and laser-assisted CVD), ALD and PVD (such as, sputtering and e-beam evaporation). In some embodiments, the gate dielectric material layer 120 is formed with a thickness ranging from about 1 nm to about 20 nm. In some embodiments, the materials of the gate dielectric material layer 120 include aluminum oxide, hafnium oxide, or combinations thereof. For example, the gate dielectric material layer 120 may be formed by depositing a composite layer of $HfO_2/Al_2O_3$ through ALD.

In some embodiments, after forming the gate dielectric material layer 120, a semiconductor material layer 130 and a binary oxide material layer 140 are sequentially formed over the gate dielectric material layer 120 to form a stack structure 10. In some embodiments, the materials of the semiconductor material layer 130 and the binary oxide material layer 140 include metal oxide materials. In some embodiments, the formation of the semiconductor material layer 130 and the binary oxide material layer 140 includes one or more deposition processes selected from CVD (such as, PECVD and laser-assisted CVD), ALD, and PVD (such as, sputtering, pulse laser deposition (PLD) and e-beam evaporation). Optionally, when the formation of the semiconductor material layer 130 includes a CVD process or ALD process, an annealing process may be included. In some embodiments, the semiconductor material layer 130 and the binary oxide material layer 140 are formed sequentially but continuously in the same PVD process or within the same reaction tool. In some embodiments, using the same deposition process, the semiconductor material layer 130 is blanketly deposited over the gate dielectric material layer 120 and then the binary oxide material layer 140 is blanketly formed over the top surface of the semiconductor material layer 130 as a capping layer. In one embodiment, the semiconductor material layer 130 is formed with a thickness ranging from about 1 nm to about 50 nm, and the binary oxide material layer 140 is formed with a thickness substantially equivalent to or smaller than about 5 nm. In some embodiments, the semiconductor material layer 130 has a thickness larger than that of the binary oxide material layer 140. In some embodiments, the material of the semiconductor material layer 130 includes indium gallium zinc oxide (IGZO), or a similar conducting oxide semiconductor material such as indium tin oxide (ITO), indium tungsten oxide (IWO), indium zinc oxide (IZO) or zinc tin oxide (ZTO) or combinations thereof. In some embodiments, the material of the binary oxide material layer 140 includes gallium oxide, indium oxide, zinc oxide, titanium oxide, aluminum oxide, mixtures thereof, or the combinations thereof. In certain embodiments, the material of the binary oxide material layer 140 includes gallium oxide (such as $Ga_2O_3$), indium oxide (such as $In_2O_3$), zinc oxide, mixtures thereof, or the combinations thereof. In one embodiment, the semiconductor material layer 130 and the binary oxide material layer 140 are formed sequentially and continuously in the same PVD process, and the semiconductor material layer 130 is made of IGZO and then the binary oxide layer is formed of one or more selected from gallium oxide, indium oxide, and zinc oxide by adjusting the stoichiometry of the reactants for forming IGZO. In other embodiments, the semiconductor material layer 130 is deposited by an ALD process and the binary oxide material layer 140 is also formed by the ALD process, and the reactants used in the ALD process may be adjusted or shifted. In certain embodiments, the material of the binary oxide material layer 140 includes titanium oxide and/or aluminum oxide. For example, the formation of the binary oxide material layer 140 (such as titanium oxide) may result in more oxygen vacancies in the semiconductor material layer 130 (such as IGZO or other suitable materials).

In the above-mentioned embodiments, through the same forming process, the semiconductor material layer 130 and the binary oxide material layer 140 may be formed with similar reactants in varying stoichiometric ratios, and shifting regions (compositional gradient regions) may be formed at the interface between the semiconductor material layer 130 and the binary oxide material layer 140.

Figure 2:
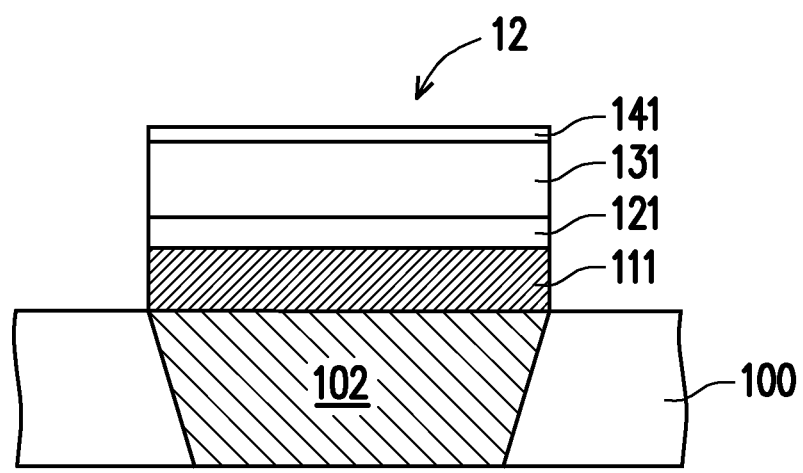

Referring to FIG. 1 and FIG. 2, in some embodiments, a patterning process is performed to the stack structure 10 of the gate material layer 110, the gate dielectric material layer 120, the semiconductor material layer 130 and the binary oxide material layer 140, so that the stack structure 10 is patterned to form a stack structure 12 having a gate layer 111, a gate dielectric layer 121, a semiconductor layer 131 and a binary oxide layer 141 stacked in sequence from the bottom to the top. In some embodiments, the stack structure 10 of the gate material layer 110, the gate dielectric material layer 120, the semiconductor material layer 130 and the binary oxide material layer 140 is patterned into the stack structure 12 in one continuous patterning process. In some embodiments, the gate material layer 110, the gate dielectric material layer 120, the semiconductor material layer 130 and the binary oxide material layer 140 are sequentially patterned through multiple patterning processes. As shown in FIG. 2, in exemplary embodiments, the patterned stack structure 12 is disposed on the connection structure 102, exposing the substrate 100. The sidewalls of the stack structure 12 in FIG. 2 may be shown to be vertically aligned or coplanar, and the stack structure 12 may be shown to be patterned into substantially the same pattern design or configuration. However, it is understood that the various layers of the stack structure 12 may have different patterns or configurations depending on product designs. In some embodiments, the patterning and the formation of the stack structure 12 include performing a photolithographic process and an anisotropic etching process. In some embodiments, a photoresist pattern (not shown) may be used as an etching mask so that portions of the stack structure 10 uncovered by the photoresist pattern are removed during the etching process, and then the photoresist pattern is removed thorough a stripping process.

Figure 3:
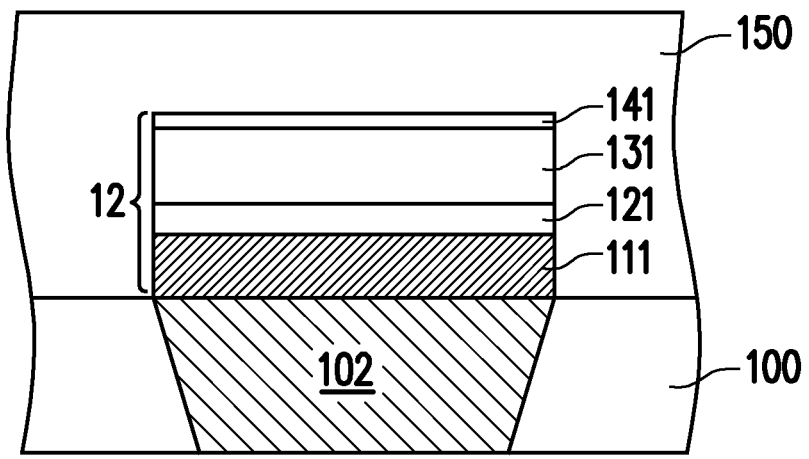

Referring to FIG. 3, an interlayer dielectric (ILD) layer 150 is formed blanketly over the substrate 100 and fully covering the stack structure 12. In some embodiments, the material of the ILD layer 150 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. It is understood that the ILD layer 150 may include one or more dielectric materials or one or more dielectric layers. In some embodiments, the ILD layer 150 is formed to a suitable thickness through CVD (such as flowable CVD (FCVD), PECVD, high Density Plasma CVD (HDPCVD), sub-atmospheric CVD (SACVD) and low-pressure CVD (LPCVD)), spin-on coating, or other suitable methods. For example, an interlayer dielectric material (not shown) may be formed by PECVD to cover the exposed substrate 100 and the stack structure 12 having the gate layer 111, the gate dielectric layer 121, the semiconductor layer 131 and the binary oxide layer 141. Optionally, an etching or polishing process may be performed to reduce the thickness of the interlayer dielectric material until a desirable thickness to form the ILD layer 150.

Figure 4:
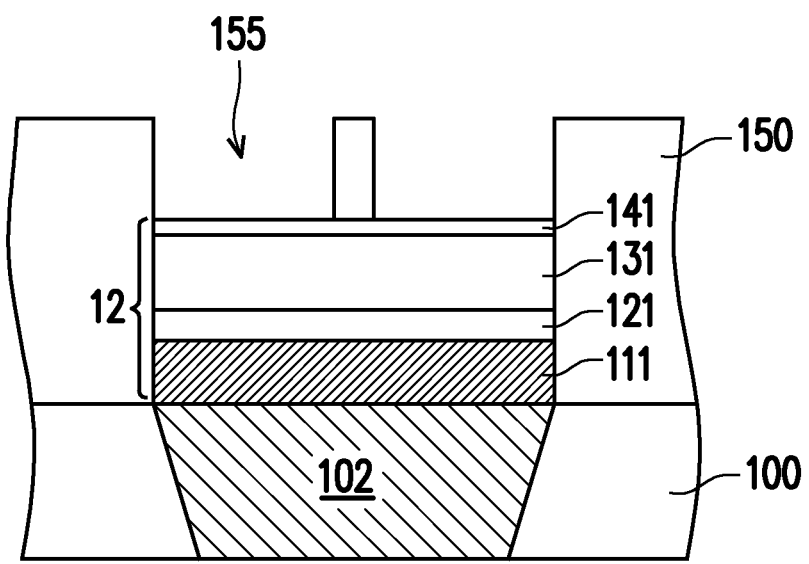

In FIG. 4, contact openings 155 are formed in the ILD layer 150 exposing the binary oxide layer 141. In some embodiments, the formation of the contact openings 155 includes forming a patterned mask layer (not shown) over the ILD layer 150, anisotropic etching the ILD layer 150 using the patterned mask layer as a mask to form contact openings 155 exposing the binary oxide layer 141. As seen in FIG. 4, the contact openings 155 are shown with substantially vertical sidewalls. It is understood that the contact openings may be formed with slant sidewalls if feasible.

Figure 5:
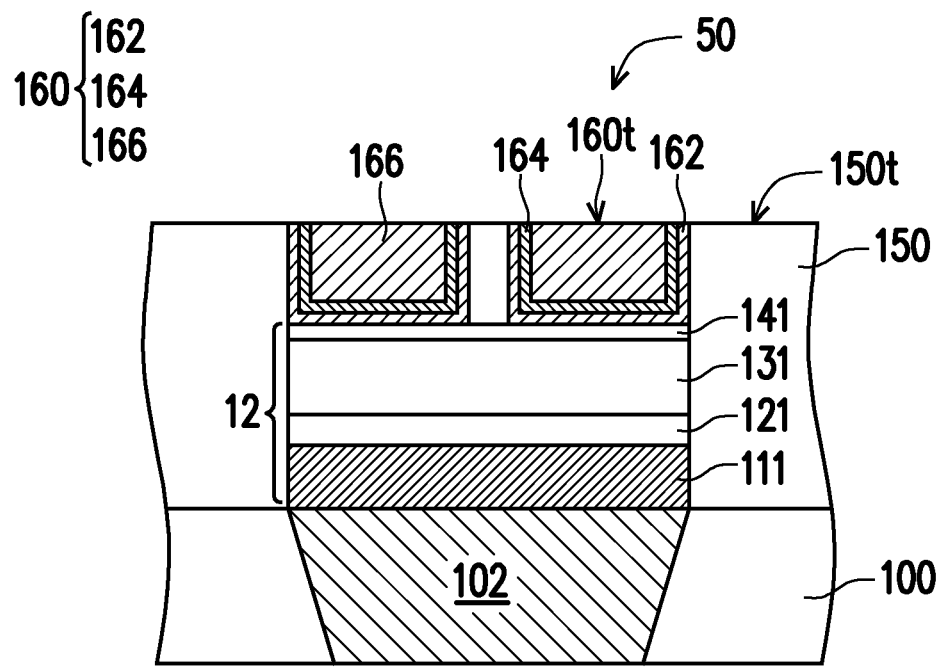

Thereafter, in FIG. 5, contact terminals 160 are formed in the contact openings 155. In some embodiments, a barrier layer 162 is deposited over the contact openings 155 and conformally covers the sidewalls and bottoms of the contact openings 155. In some embodiments, a seed layer 164 is formed over the contact openings 155 and on the barrier layer 162. In some embodiments, the barrier layer 162 is formed before forming the seed layer 164 to prevent out-diffusion of the material of the seed layer 164. After the seed layer 164 is formed to cover the sidewalls and the bottoms of the contact openings 155, metallic contacts 166 are then formed on the seed layer 164 within the contact openings 155 and fill the contact openings 155.

In some embodiments, a barrier material (not shown) and a seed material are sequentially formed over the contact openings 155 and conformally covering the exposed surfaces of the contact openings 155, and a metallic material (not shown) is then filled into the contact openings 155 to form the metallic contacts 166. The barrier material, the seed material and the metallic material may individually include one or more materials selected tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the seed material is formed by CVD or PVD. In some embodiments, the metallic material is formed by CVD or PVD. In alternative embodiments, the formation of the metallic material may include performing a plating process (such as electrochemical plating (ECP)). In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the metallic contact 166 includes a tungsten contact and the barrier layer 162 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. In some embodiments, the barrier layer 162, the seed layer 164 and the metallic contact 166 constitute contact terminals 160. As seen in FIG. 5, the top surface 150t of the ILD layer 150 is substantially flush with and levelled with the top surfaces 160t of the contact terminals 160. In some embodiments, the contact terminals 160 function as the source and drain terminals of the transistor. In FIG. 5, a transistor structure 50 is obtained. The transistor structure 50 includes the stack structure 12 having the gate layer 111, the gate dielectric layer 121, the semiconductor layer 131 and the binary oxide layer 141 sequentially stacked from the bottom to the top, and the contact terminals 160 located on the stack structure 12. The semiconductor layer 131 functions as a channel layer, and the binary oxide layer 141 located between the contact terminals 160 and the semiconductor layer 131 helps lowering the contact resistance of the source and drain terminals. In some embodiments, the transistor structure 50 is a bottom-gated transistor structure or a back-gate transistor structure.

Figure 6:
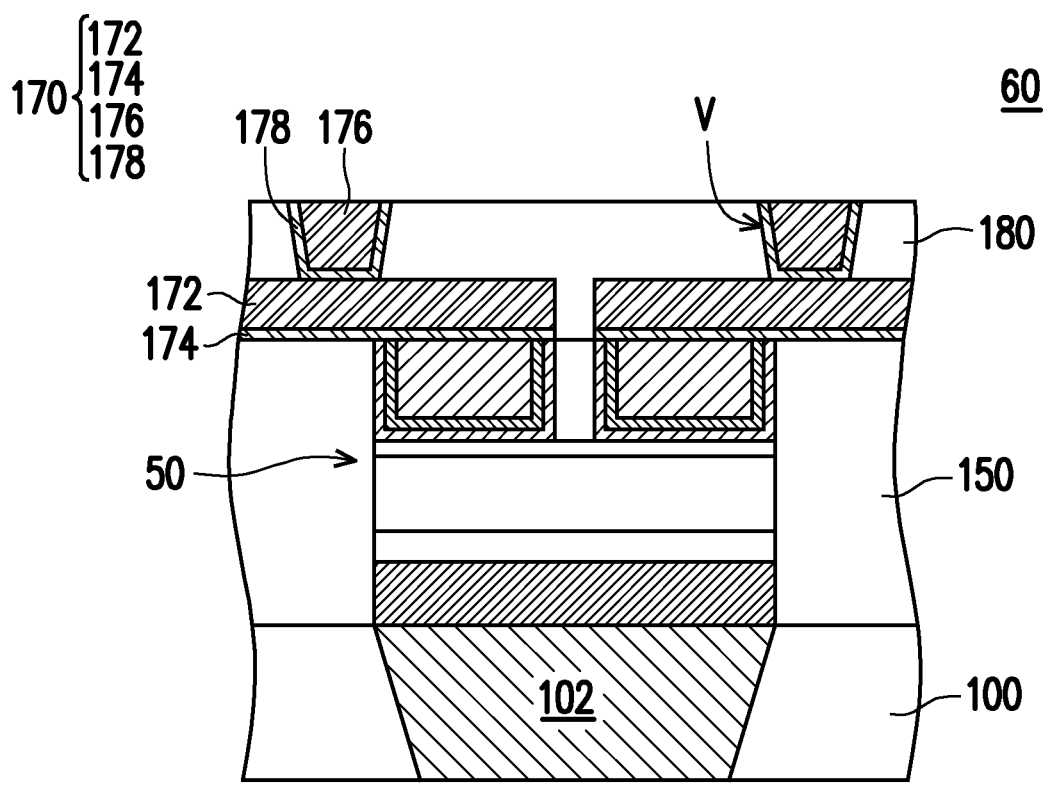

Referring to FIG. 6, in certain embodiments, an interconnecting structure 170 is formed on the ILD layer 150 and over the contact terminals 160, and the semiconductor device structure 60 is formed. In one embodiment, the interconnecting structure 170 is in direct contact with the contact terminals 160 and is electrically connected with the contact terminals 160 of the transistor structure 50, so that the transistor structure 50 is further electrical connected to other components or devices. In some embodiments, the interconnecting structure 170 includes first metal lines 172 formed on first liner layers 174 and first metal vias 176 surrounded by the second liner layers 178. In some embodiments, a first liner material (not shown) is directly formed on the ILD layer 150 and on the top surfaces 160t of the contact terminals 160, a first metal layer (not shown) is formed on the first liner material, and then the first liner material and the first metal layer are patterned into the first metal lines 172 and the first liner layers 174 using photolithographic and etching techniques. The first liner material may be formed through, for example, PVD (such as sputtering), or CVD or the like. In some embodiments, the first liner material includes, for example, tantalum, tantalum nitride, titanium, titanium nitride, tungsten, tungsten nitride, combinations thereof, or other suitable materials. In some embodiments, the first liner layers 174 may prevent out-diffusion of the material of the first metal lines 172 and/or improve the adhesion of the first metal lines 172. In some embodiments, the first metal layer may be formed by performing a plating process such as electrochemical plating (ECP) or electroless plating, a PVD process or a CVD process. In some embodiments, the first metal layer includes, for example, copper, copper-aluminum alloys, tantalum, titanium, tungsten, alloys thereof, or other suitable metal materials.

In some embodiments, as shown in FIG. 6, the first metal lines 172 are in direct contact with and electrically connected with the contact terminals 160. For example, the first metal lines 172 may include copper or copper alloys, and may be formed by performing a PVD process and a CVD process. In one embodiment, a thickness of the first metal lines 172 may be adjusted according to design requirements. As shown in FIG. 6, in certain embodiments, another ILD layer 180 is formed over the ILD layer 150 and the first metal lines 172. The materials and formation methods of the ILD layer 180 may be similar to those of the ILD layer 150 and detailed descriptions thereof shall be omitted herein for simplicity. Later, via openings V are formed in the ILD layer 180 to partially expose the underlying first metal lines 172. The method(s) for forming the via openings V are similar to the methods for forming the contact openings 155. As seen in FIG. 6, the via openings V are shown with slant sidewalls. It is understood that the via openings may be formed with substantially vertical sidewalls if feasible.

In some embodiments, in FIG. 6, the second liner layers 178 are formed in the via openings V covering the sidewalls and the bottoms of the via openings V and then the first metal vias 176 are formed on the second liner layers 178 and within the via openings V. In some embodiments, a second liner material (not shown) is formed over the via openings V and conformally covering the exposed surfaces of the via openings V, and then a second metal layer (not shown) is formed over the ILD layer 180 and filled into the openings V. The formation methods and the materials of the second liner layers 178 are similar to those of the first liner layers 174. The formation methods and the materials of the first metal vias 176 are similar to those of the first metal lines 172. Detailed descriptions shall be skipped herein for simplicity. However, it is understood that the material of the first metal lines 172 may be different from that of the first metal vias 176, and the material of the first liner layer 174 may be different from that of the second liner layer 178.

The number and configurations of the metal lines and/or metal vias of the interconnecting structure 170 shown in FIG. 6 are merely for illustration, in some alternative embodiments, more than two metal lines or metal vias may be formed in accordance with actual design requirements. Furthermore, multiple levels of interconnecting structures may be formed for electrical connection and interconnection.

The semiconductor device structure 60 illustrates an integrated circuit, or portion thereof. In some embodiments, the semiconductor device structure 60 comprises active devices such as oxide semiconductor thin film transistors, high voltage transistors, and/or other suitable components. In some embodiments, the semiconductor device structure 60 additionally includes passive components, such as resistors, capacitors, inductors, and/or fuses. In some embodiments, additional steps may be provided before, during, and after the process steps depicted from FIG. 1 to FIG. 6, and some of the steps described above may be replaced or eliminated, for additional embodiments of the method.

In the illustrated embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during middle-of-line processes. In one embodiment, the transistor structure 50 includes an IGZO thin film transistor.

In the exemplary embodiments, the formation of the binary oxide layer between the channel layer (e.g. semiconductor layer) and the source and drain terminals leads to more oxygen vacancies and higher doping in the channel layer under the contact areas of channel layer as well as lower contact resistance between the channel layer and the source and drain terminals. Overall, the performance of the semiconductor device is enhanced.

In the above-mentioned embodiments, through the same deposition process, the binary oxide layer and the semiconductor channel layer may be formed within the same chamber in a self-aligned way, and the binary oxide layer formed as a capping layer over the surface of the semiconductor layer can be appropriately controlled. In some embodiments, the capping binary oxide layer formed over the semiconductor layer modulates the surface characteristics of the semiconductor layer and lowers the contact resistance between the semiconductor layer and the source and drain terminals.

Figure 7:
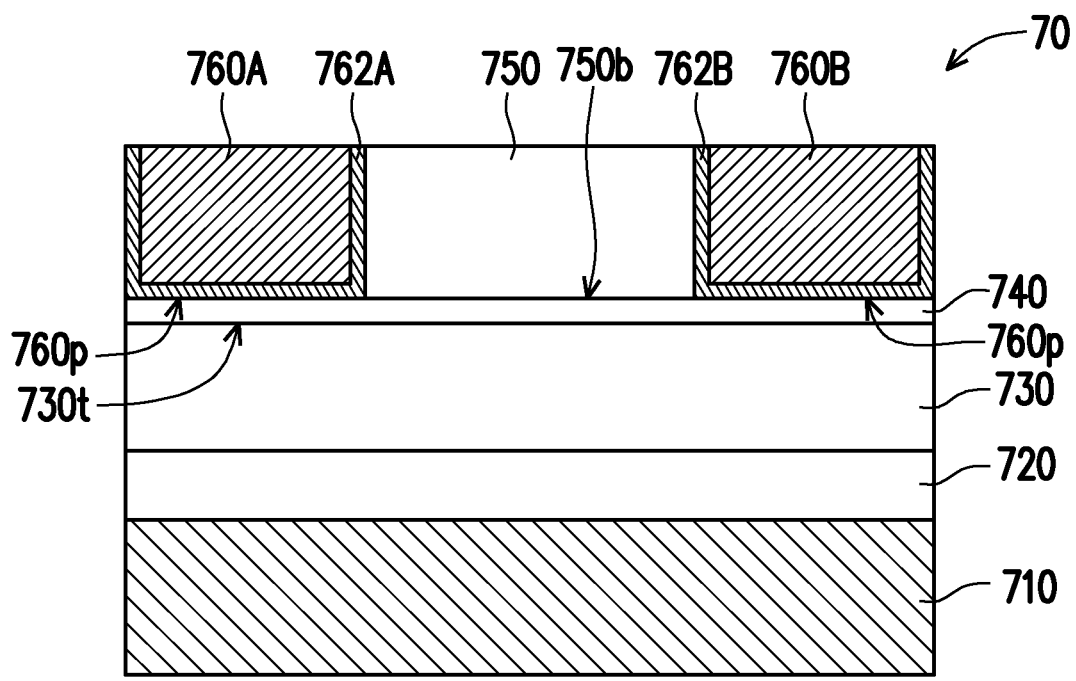
FIG. 7 and FIG. 8 are schematic cross-sectional views showing a semiconductor device in accordance with some embodiments of the disclosure.

FIG. 7 is a schematic cross-sectional view showing a semiconductor device in accordance with some embodiments of the disclosure. The exemplary structure shown in FIG. 7 may be fabricated following the process steps as described in the previous embodiments as shown from FIG. 1 to FIG. 6, but it is understood that any other compatible process steps or methods may be utilized and comprehensible modifications or adjustments may be made for forming the exemplary structure of this disclosure. Referring to FIG. 7, in some embodiments, the semiconductor device structure 70 includes a stack structure of a gate layer 710, a gate dielectric layer 720, a semiconductor layer 730 and a binary oxide layer 740 sequentially stacked from the bottom to the top. In some embodiments, the semiconductor device structure 70 includes a source terminal 760A and a drain terminal 760B located directly on the binary oxide layer 740 of the stack structure. In some embodiments, the source terminal 760A and the drain terminal 760B are separate from each other by an interlayer dielectric (ILD) layer 750 located there-between. In some embodiments, the source terminal 760A includes a barrier layer 762A and the drain terminal 760B also includes a barrier layer 762B. In some embodiments, the binary oxide layer 740 extends on and over the top surface 730t of the semiconductor layer 730, and the binary oxide layer is in direct contact with the source terminal 760A and the drain terminal 760B. In some embodiments, the ILD layer 750 sandwiched between the source terminal 760A and the drain terminal 760B is located directly on the binary oxide layer 740. In FIG. 7, the binary oxide layer 740 is sandwiched between the top surface 730t of the semiconductor layer 730 and the bottom surfaces 760p of the source terminal 760A and the drain terminal 760B, and sandwiched between the top surface 730t of the semiconductor layer 730 and the bottom surface 750b of the ILD layer 750. Applicable materials for individual layers or elements are described in the previous embodiments and will not be repeated herein again.

Figure 8:
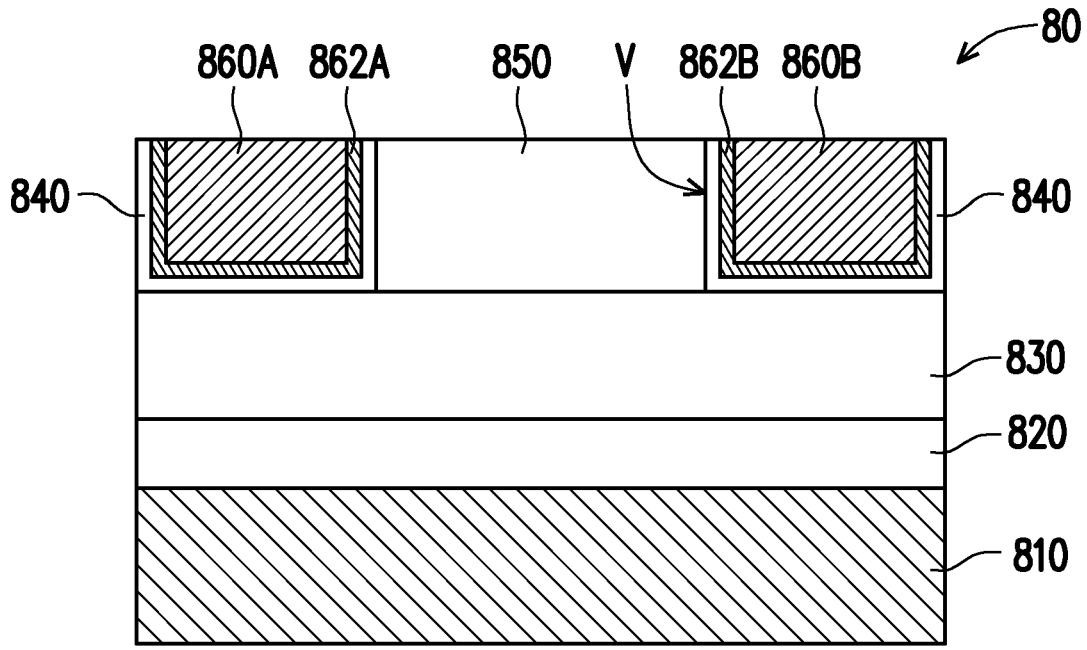

FIG. 8 is a schematic cross-sectional view showing a semiconductor device in accordance with some embodiments of the disclosure. The structure shown in FIG. 8 is similar to but different from the structure shown in FIG. 7, and the main structural difference lies in that the location of the binary oxide layer 840 in the semiconductor device structure 80 as shown in FIG. 8. Referring to FIG. 8, in some embodiments, the semiconductor device structure 80 includes a stack structure of a gate layer 810, a gate dielectric layer 820, and a semiconductor layer 830 sequentially stacked from the bottom to the top. In some embodiments, the structure 80 includes a source terminal 860A and a drain terminal 860B located on the semiconductor layer 830 of the stack structure. In some embodiments, the source terminal 860A and the drain terminal 860B are separate from each other by an interlayer dielectric (ILD) layer 850. In FIG. 8, each of the source terminal 860A and the drain terminal 860B is surrounded by a binary oxide layer 840. In some embodiments, either the source terminal 860A or the drain terminal 860B is surrounded by the binary oxide layer 840, and the binary oxide layer 840 covers the sidewalls and the bottom surfaces of the source terminal 860A and the drain terminal 860B. In some embodiments, the source terminal 860A and the drain terminal 860B are isolated from the underlying semiconductor layer 830 and the ILD layer 850 by the binary oxide layer 840. In some embodiments, the binary oxide layer 840 is located only directly under the source and drain terminals 860A, 860B and between the semiconductor layer 830 and the source and drain terminals 860A, 860B, and the ILD layer 850 located there-between is in direct contact with the semiconductor layer 830. In FIG. 8, the source terminal 860A includes a barrier layer 862A and the drain terminal 860B also includes a barrier layer 862B. The exemplary structure shown in FIG. 8 may be fabricated following similar process steps as described in the previous embodiments as shown from FIG. 1 to FIG. 6. However, in some embodiments, after the formation of the via openings, the binary oxide layer 840 may be formed within the via openings V before the formation of the barrier layer 862A, 862B. In some embodiments, the binary oxide layer 840 is deposited in the via openings through at least one deposition process selected from CVD, ALD, and PVD, and the binary oxide layer 840 conformally covers the exposed surfaces of the via openings. In some embodiments, the formation of the semiconductor layer 830 and the formation of the binary oxide layer 840 may go through different deposition processes.

In the exemplary embodiments, the formation of the binary oxide layer located between the channel layer (e.g. semiconductor layer) and the source and drain terminals leads to reduced contact resistance between the channel layer and the source and drain terminals. Hence, the performance of the semiconductor device is boosted.

FIG. 10 to FIG. 15 are schematic cross-sectional views of various stages in a manufacturing method of a semiconductor device in accordance with some embodiments of the disclosure.

Figure 10:
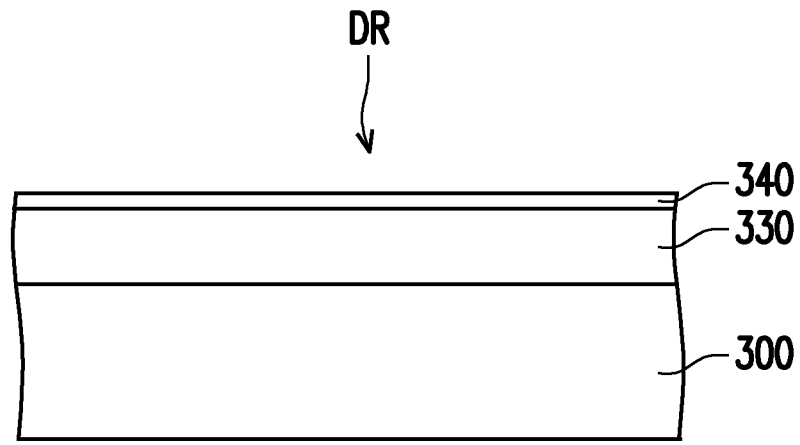
FIG. 10 to FIG. 15 are schematic cross-sectional views of various stages in a manufacturing method of a semiconductor device in accordance with some embodiments of the disclosure.

Referring to FIG. 10, in some embodiments, a substrate 300 is provided. In FIGS. 10-15, only a portion of the device region DR of the substrate 300 is shown for illustration purposes. In some embodiments, the substrate 300 is similar to the substrate 100, 900 in the previous embodiments, and the substrate 300 may include one or more active component such as transistors, diodes, optoelectronic devices and/or one or more passive components such as capacitors, inductors and resistors. In some embodiments, as shown in FIG. 10, a semiconductor material layer 330 and a binary oxide material layer 340 are sequentially formed over the substrate 300. In one embodiment, the semiconductor material layer 330 is formed with a thickness ranging from about 1 nm to about 50 nm, and the binary oxide material layer 340 is formed with a thickness substantially equivalent to or smaller than about 5 nm. In some embodiments, the semiconductor material layer 330 has a thickness larger than that of the binary oxide material layer 340.

In some embodiments, the material of the semiconductor material layer 330 includes indium gallium zinc oxide (IGZO), or a similar conducting oxide semiconductor material such as indium tin oxide (ITO), indium tungsten oxide (IWO), indium zinc oxide (IZO) or zinc tin oxide (ZTO) or combinations thereof. In some embodiments, the material of the binary oxide material layer 340 includes gallium oxide, indium oxide, zinc oxide, mixtures thereof, or the combinations thereof. In some embodiments, the formation of the semiconductor material layer 330 and the binary oxide material layer 340 includes one or more deposition processes selected from CVD, ALD, and PVD. In one embodiment, the semiconductor material layer 330 and the binary oxide material layer 340 are formed sequentially and continuously in the same PVD process, and the semiconductor material layer 330 is made of IGZO and then the binary oxide layer 340 is formed of one or more selected from gallium oxide, indium oxide, and zinc oxide by adjusting the stoichiometry of the reactants for forming IGZO. In certain embodiments, the material of the binary oxide material layer 340 includes titanium oxide and/or aluminum oxide.

In some embodiments, using the same deposition process, the semiconductor material layer 330 is blanketly deposited over the substrate 300 and then the binary oxide material layer 340 is blanketly formed over the top surface of the semiconductor material layer 330 as a capping layer. In some embodiments, through the same forming process, the semiconductor material layer 330 and the binary oxide material layer 340 may be formed with similar reactants in varying stoichiometric ratios, and shifting regions (compositional gradient regions) may be formed at the interface between the semiconductor material layer 330 and the binary oxide material layer 340.

Figure 11:
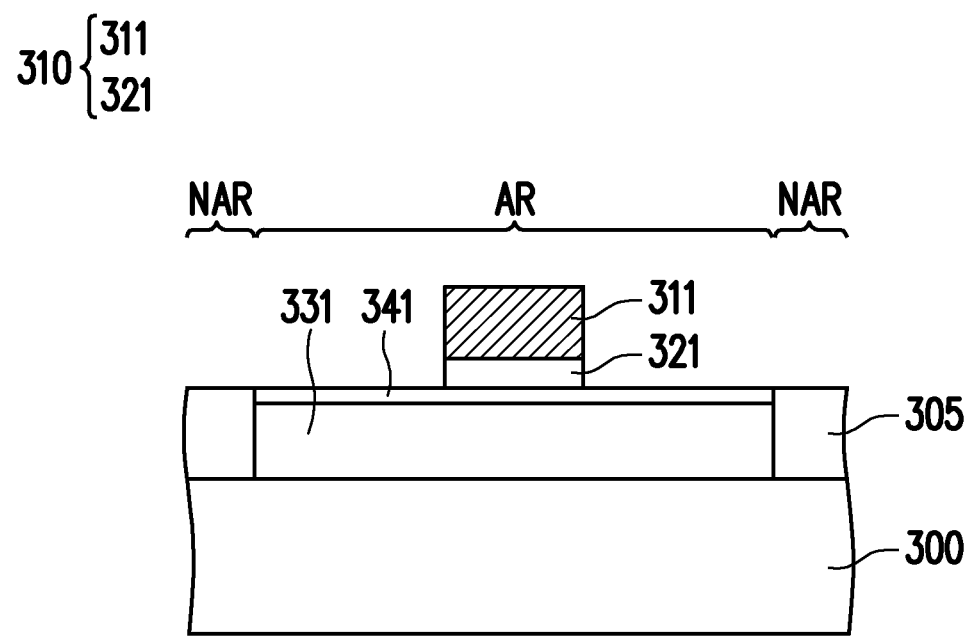

Referring to FIG. 10 and FIG. 11, in some embodiments, the semiconductor material layer 330 and the binary oxide material layer 340 are patterned to form a semiconductor layer 331 and a binary oxide layer 341 on the substrate 300 and an active region AR is defined through the patterning process. Later, isolation structures 305 are formed in a non-active region NAR surrounding the active region AR for isolation. As shown in FIG. 11, in some embodiments, more than one isolation structures 305 are formed on the substrate 300. In certain embodiments, the isolation structures 305 are trench isolation structures, and the insulator material of the isolation structures 305 includes silicon oxide, silicon nitride, silicon oxynitride, a spin-on dielectric material, or a low-k dielectric material.

Referring to FIG. 11, a gate dielectric layer 321 and a gate layer 311 are formed on the binary oxide layer 341. In some embodiments, a gate dielectric material layer (not shown) and a gate material layer (not shown) are sequentially formed over the binary oxide layer 341 and the isolation structures 305, and then are patterned into the stack of the gate dielectric layer 321 and the gate layer 311 through photolithographic and etching processes. As shown in FIG. 11, in exemplary embodiments, the stack structure 310 of the gate dielectric layer 321 and the gate layer 311 is disposed on the stack structure of the semiconductor layer 331 and the binary oxide layer 341. In some embodiments, the stack structure of the gate dielectric layer 321 and the gate layer 311 partially covers the underlying stack structure of the semiconductor layer 331 and the binary oxide layer 341, exposing portions of the stack structure of the semiconductor layer 331 and the binary oxide layer 341. In some embodiments, the stack structure of the semiconductor layer 331 and the binary oxide layer 341 is located within the active region AR, and the gate structure 310 of the gate dielectric layer 321 and the gate layer 311 is located within the active region AR. The sidewalls of the stack structure of the gate dielectric layer 321 and the gate layer 311 in FIG. 11 may be shown to be vertically aligned or coplanar, and the stack structure of the gate dielectric layer 321 and the gate layer 311 and the stack structure of the semiconductor layer 331 and the binary oxide layer 341 may be shown to be patterned into substantially different pattern designs or configurations. However, it is understood that the various layers of the stack structure may have different patterns or configurations depending on product designs.

Figure 12:
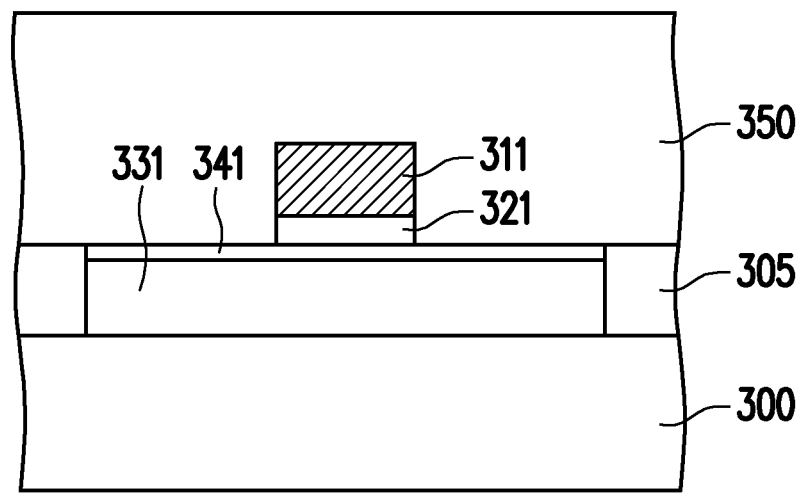

In FIG. 12, an ILD layer 350 is formed over the substrate 300 covering the stack structure of the gate dielectric layer 321 and the gate layer 311, the exposed binary oxide layer 341 and the isolation structures 305. The materials and the formation methods of the ILD layer 350 are similar to those of the ILD layer(s) as described in the above paragraphs, and details will be omitted herein for simplicity.

Figure 13:
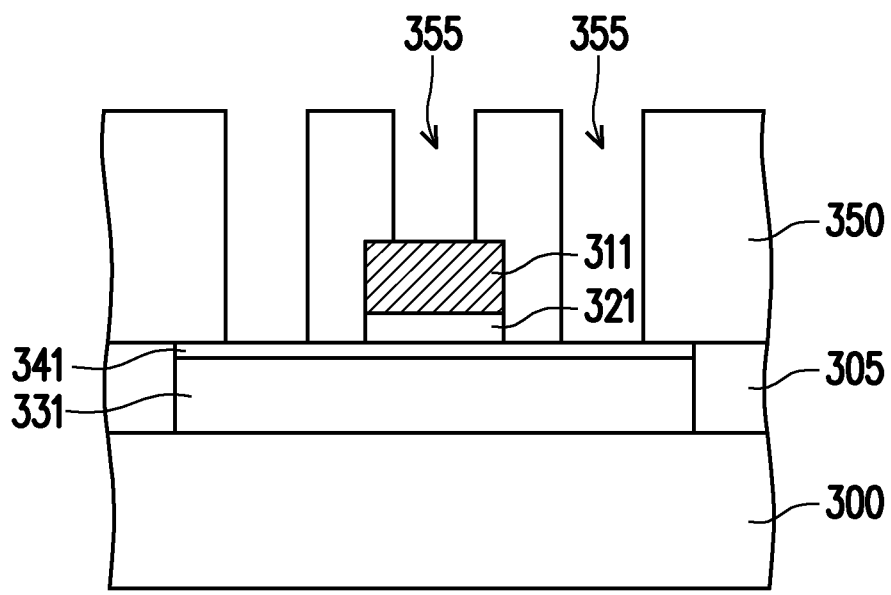

Referring to FIG. 13, contact openings 355 are formed in the ILD layer 350 to respectively expose portions of the binary oxide layer 341 and the gate layer 311. As seen in FIG. 13, the contact openings 355 are shown with substantially vertical sidewalls. It is understood that the contact openings may be formed with slant sidewalls if feasible.

Figure 14:
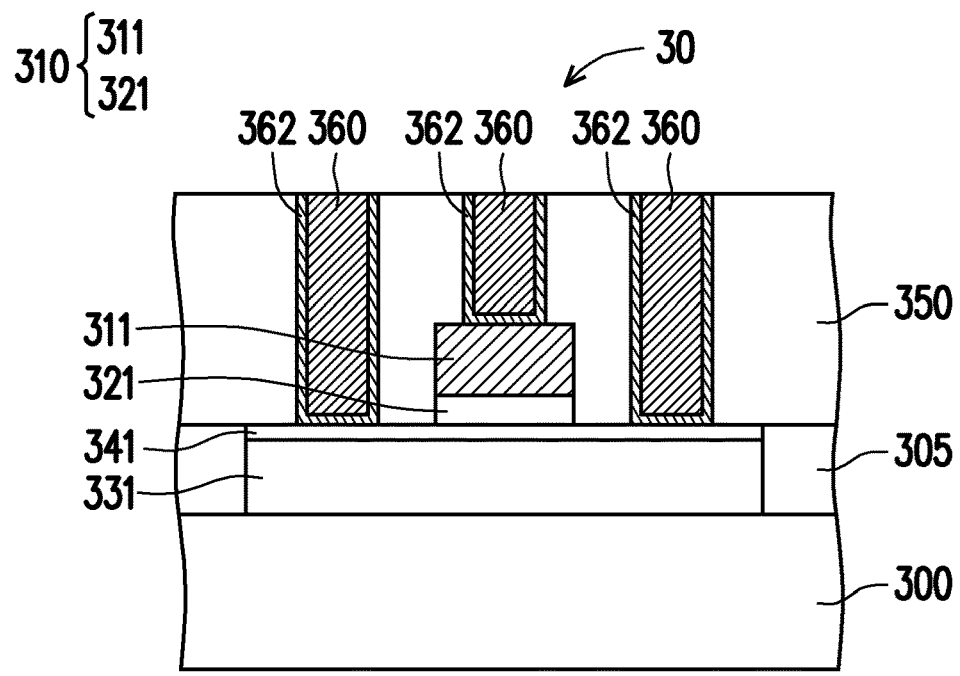

Thereafter, in FIG. 14, contact terminals 360 are formed in the contact openings 355. In some embodiments, the contact terminals 360 are respectively connected to the gate layer 311 and the binary oxide layer 341. In certain embodiments, a barrier layer 362 is deposited over the contact openings 355 and conformally covers the sidewalls and bottoms of the contact openings 355. Similar materials and formation methods for forming the contact terminals 160 may be used for forming the contact terminals 360, and the contact terminals 360 may be formed with seed layer and/or adhesion layer, but the details shall be skipped herein for simplicity.

Referring to FIG. 14, in some embodiments, a transistor structure 30 is obtained and the contact terminals 360 function as the source and drain terminals of the transistor. In FIG. 14, the transistor structure 30 includes the gate structure 310 having the gate layer 311 stacked on the gate dielectric layer 321, the stack structure of the binary oxide layer 341 stacked on the semiconductor layer 331, and the contact terminals 360 located on the gate structure 310 and on the binary oxide layer 341. The semiconductor layer 331 functions as a channel layer, and the binary oxide layer 341 located between the contact terminals 360 and the semiconductor layer 331 helps lowering the contact resistance of the source and drain terminals. In some embodiments, the transistor structure 30 is a top-gated transistor structure or a front gate transistor structure.

Figure 15:
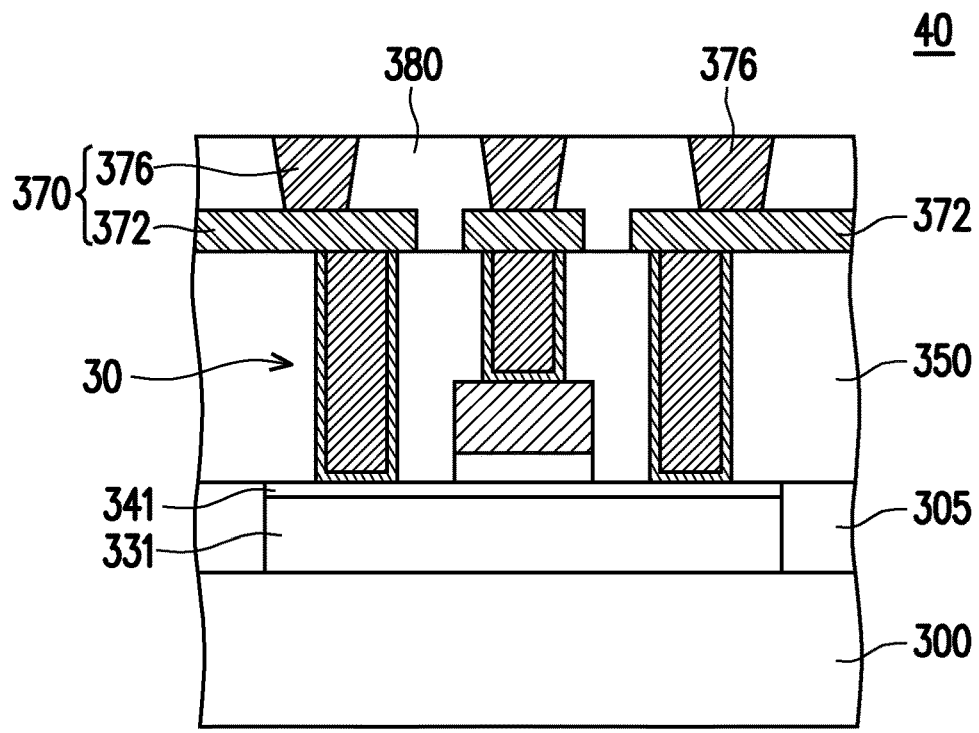

Referring to FIG. 15, in certain embodiments, an interconnecting structure 370 and another ILD layer 380 are formed on the ILD layer 350, and the semiconductor device structure 40 is formed. In some embodiments, the interconnecting structure 370 is formed on and in direct contact with the contact terminals 360, and is electrically connected with the contact terminals 360 of the transistor structure 30, so that the transistor structure 30 is further electrical connected to other components or devices. In some embodiments, the interconnecting structure 370 includes metal lines 372 and metal vias 376 connected to the metal lines 372. Similar materials and formation methods for forming the interconnecting structure 170 may be used for forming the interconnecting structure 370, and the interconnecting structure 370 may be formed with the liner layer(s), seed layer and/or barrier/adhesion layer, and multiple levels of interconnecting structures may be formed for electrical connection and interconnection.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 16:
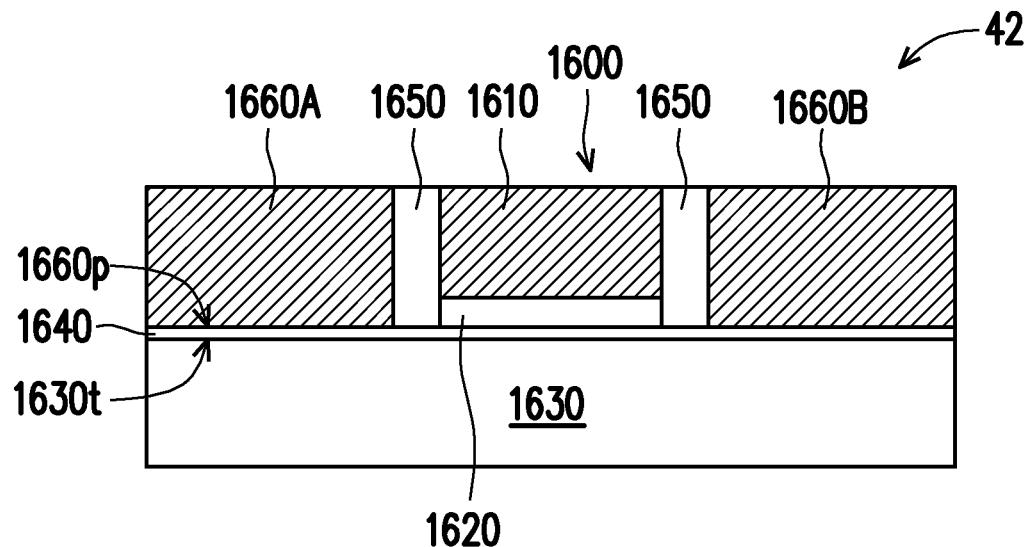
FIG. 16 and FIG. 17 are schematic cross-sectional views showing a semiconductor device in accordance with some embodiments of the disclosure.

FIG. 16 is a schematic cross-sectional view showing a semiconductor device in accordance with some embodiments of the disclosure. Referring to FIG. 16, in some embodiments, the semiconductor device structure 42 includes a gate structure 1600 of a gate layer 1610 and a gate dielectric layer 1620 stacked on the stack structure of a binary oxide layer 1640 and a semiconductor layer 1630 (from the top to the bottom). In some embodiments, the semiconductor device structure 42 includes a source terminal 1660A and a drain terminal 1660B located directly on the binary oxide layer 1640. In some embodiments, the source terminal 1660A and the drain terminal 1660B are located at two opposite sides of the gate structure 1600 and are separate from the gate structure 1600 by an interlayer dielectric (ILD) layer 1650 located there-between. In some embodiments, the source terminal 1660A and the drain terminal 1660B may further include seed layer(s) and/or adhesion/barrier layer(s). In some embodiments, the binary oxide layer 1640 extends on and over the top surface 1630$t$ of the semiconductor layer 1630, and the binary oxide layer 1640 is in direct contact with the source terminal 1660A and the drain terminal 1660B. In some embodiments, the ILD layer 1650 sandwiched between the source terminal 1660A and the drain terminal 1660B is located directly on the binary oxide layer 1640. In FIG. 16, the binary oxide layer 1640 is sandwiched between the top surface 1630$t$ of the semiconductor layer 1630 and the bottom surfaces 1660$p$ of the source and drain terminals 1660A, 1660B, and sandwiched between the top surface 1630$t$ of the semiconductor layer 1630 and the bottom surface of the gate dielectric layer 1620.

Figure 17:
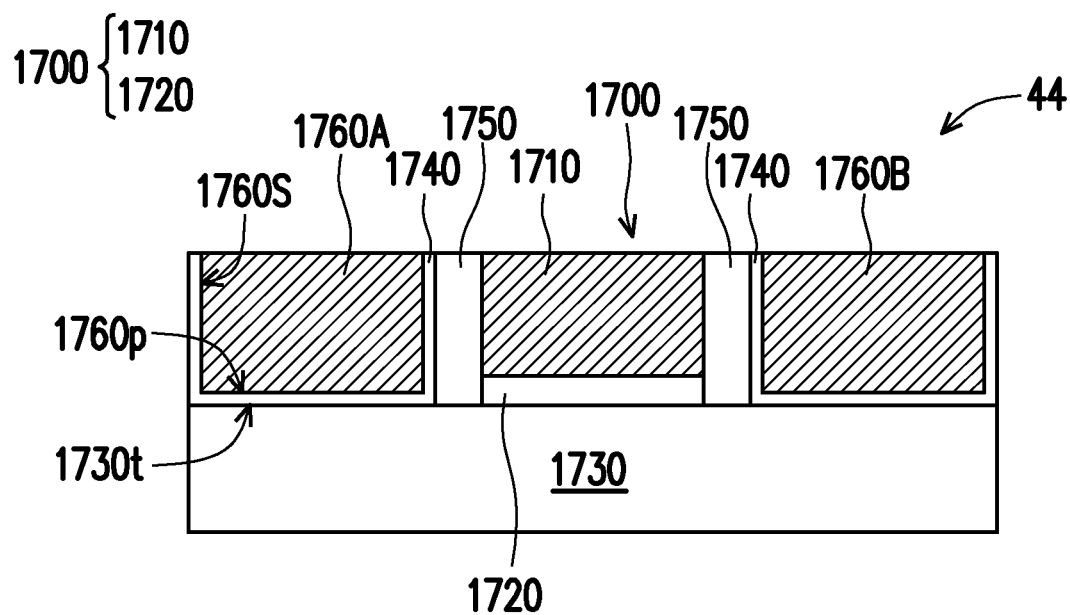

FIG. 17 is a schematic cross-sectional view showing a semiconductor device in accordance with some embodiments of the disclosure. The structure shown in FIG. 17 is similar to but different from the structure shown in FIG. 16, and the main structural difference lies in that the location of the binary oxide layer 1740 in the semiconductor device structure 44 as shown in FIG. 17. Referring to FIG. 17, in some embodiments, the semiconductor device structure 44 includes a gate structure 1700 of a gate layer 1710 and a gate dielectric layer 1720 stacked on a semiconductor layer 1730. In some embodiments, the structure 44 includes a source terminal 1760A and a drain terminal 1760B located on the semiconductor layer 1730 with a binary oxide layer 1740 located there-between. In some embodiments, the source terminal 1760A and the drain terminal 1760B are located at two opposite sides of the gate structure 1700 and are separate from the gate structure 1700 by an interlayer dielectric (ILD) layer 1750. In FIG. 17, each of the source terminal 1760A and the drain terminal 1760B is surrounded by a binary oxide layer 1740. In some embodiments, either the source terminal 1760A or the drain terminal 1760B is surrounded by the binary oxide layer 1740, and the binary oxide layer 1740 covers the sidewalls 1760$s$ and the bottom surfaces 1760$p$ of the source terminal 1760A and the drain terminal 1760B. In some embodiments, the source terminal 1760A and the drain terminal 1760B are isolated from the underlying semiconductor layer 1730 and the ILD layer 1750 by the binary oxide layer 1740. In some embodiments, the ILD layer 1750 and the gate dielectric layer 1720 are in direct contact with the semiconductor layer 1730. In FIG. 17, the binary oxide layers 1740 are sandwiched between the top surface 1730$t$ of the semiconductor layer 1730 and the respective bottom surfaces of the source and drain terminals 1760A, 1760B.

Figure 18:
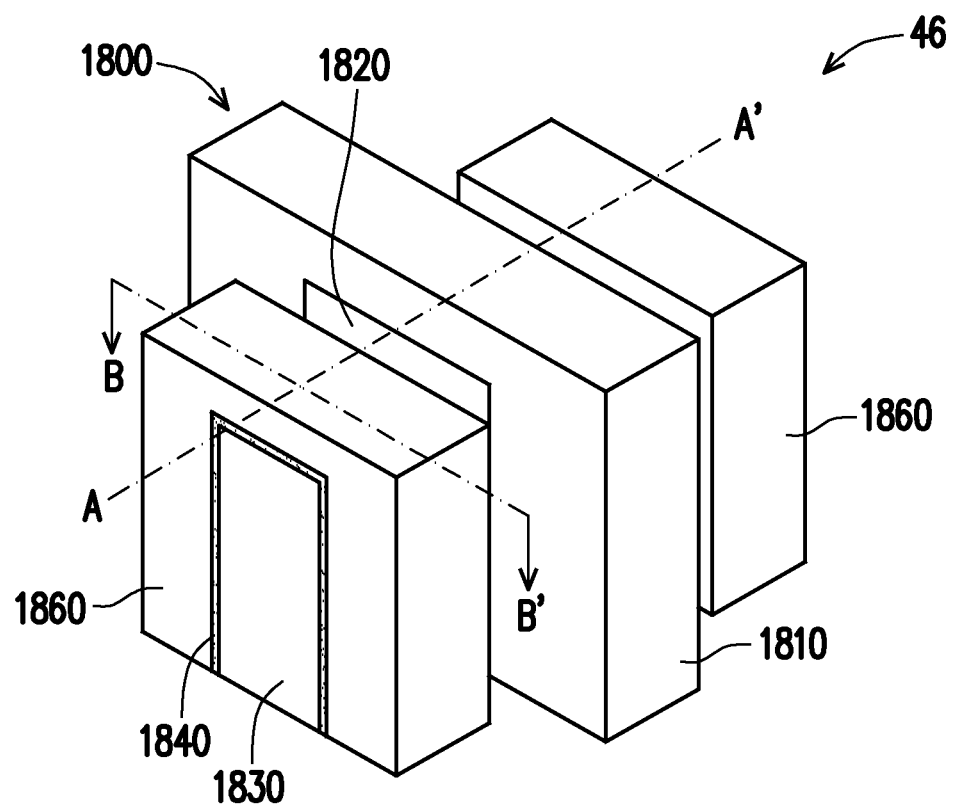
FIG. 18 is a schematic three-dimensional view showing a semiconductor device in accordance with some embodiments of the disclosure.
Figure 19:
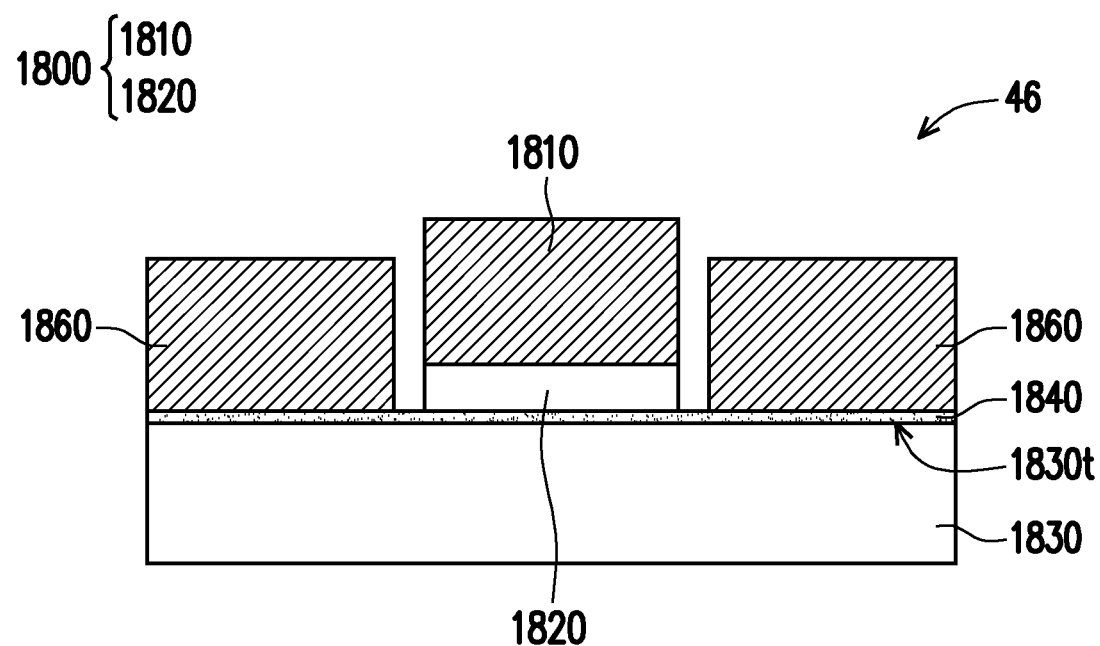
FIG. 19 and FIG. 20 are schematic cross-sectional views showing the semiconductor device in accordance with some embodiments of the disclosure.
Figure 20:
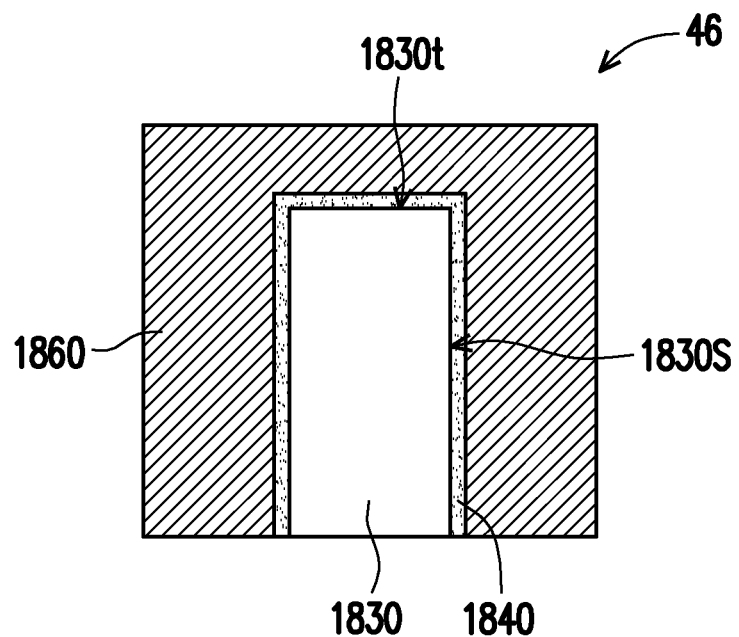

FIG. 18 is a schematic three-dimensional view showing a semiconductor device in accordance with some embodiments of the disclosure. FIG. 19 and FIG. 20 are schematic cross-sectional views respectively along the lines A-A' and B-B' showing the semiconductor device of FIG. 18 in accordance with some embodiments of the disclosure.

Referring to FIG. 18, in some embodiments, the semiconductor device structure 46 includes a semiconductor layer 1830 and a binary oxide layer 1840 located on and around the semiconductor layer 1830. From FIG. 18, FIG. 19 and FIG. 20, it is seen that the binary oxide layer 1840 surrounds and covers not just the top surface 1830$t$ but also two opposite side surfaces 1830$s$ of the semiconductor layer 1830. That is, the binary oxide layer 1840 covers at least three sides of the semiconductor layer 1830. Referring to FIG. 18 and FIG. 19, a gate structure 1800 of a gate layer 1810 and a gate dielectric layer 1820 is disposed on and surrounds the top side and the two opposite sides of the stack structure of the binary oxide layer 1840 and the semiconductor layer 1830. Referring to FIG. 18, in some embodiments, the gate structure 1800 may shape like a reverse U shape wrapping around the binary oxide layer 1840 and the semiconductor layer 1830. In some embodiments, the semiconductor device structure 46 includes source and drain terminals 1860 located directly on the binary oxide layer 1840, and the source and drain terminals 1860 each may shape like a reverse U shape wrapping around the binary oxide layer 1840 and the semiconductor layer 1830. In some embodiments, the source and drain terminals 1860 are located at two opposite sides of the gate structure 1800 and are separate from the gate structure 1800 by an interlayer dielectric (ILD) layer (not shown) located there-between. In FIG. 18, FIG. 19 and FIG. 20, the ILD layer is not shown for simplicity. In some embodiments, the source and drain terminals 1860 may further include seed layer(s) and/or adhesion/barrier layer(s). In some embodiments, the binary oxide layer 1840 is in direct contact with the source and drain terminals 1860 and in direct contact with the gate dielectric layer 1820. That is, the binary oxide layer 1840 is sandwiched between the semiconductor layer 1830 and the gate structure 1800 and the source and drain terminals 1860. In some embodiments, the semiconductor device structure 46 includes a double-gated transistor structure.

Figure 21:
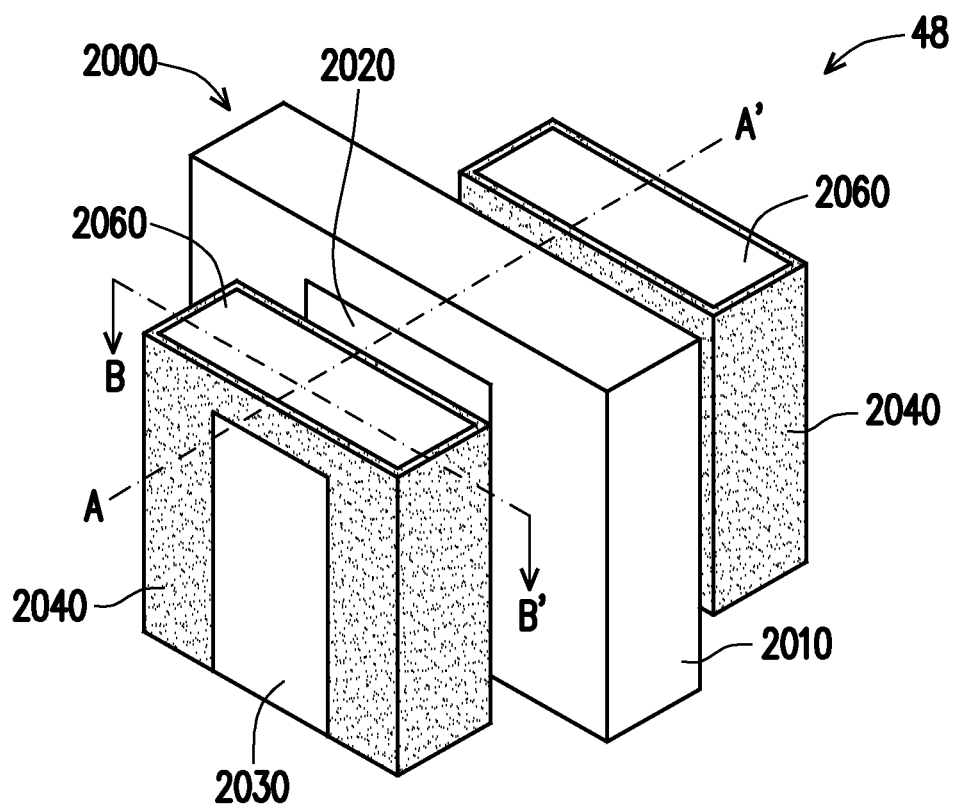
FIG. 21 is a schematic three-dimensional view showing a semiconductor device in accordance with some embodiments of the disclosure.
Figure 22:
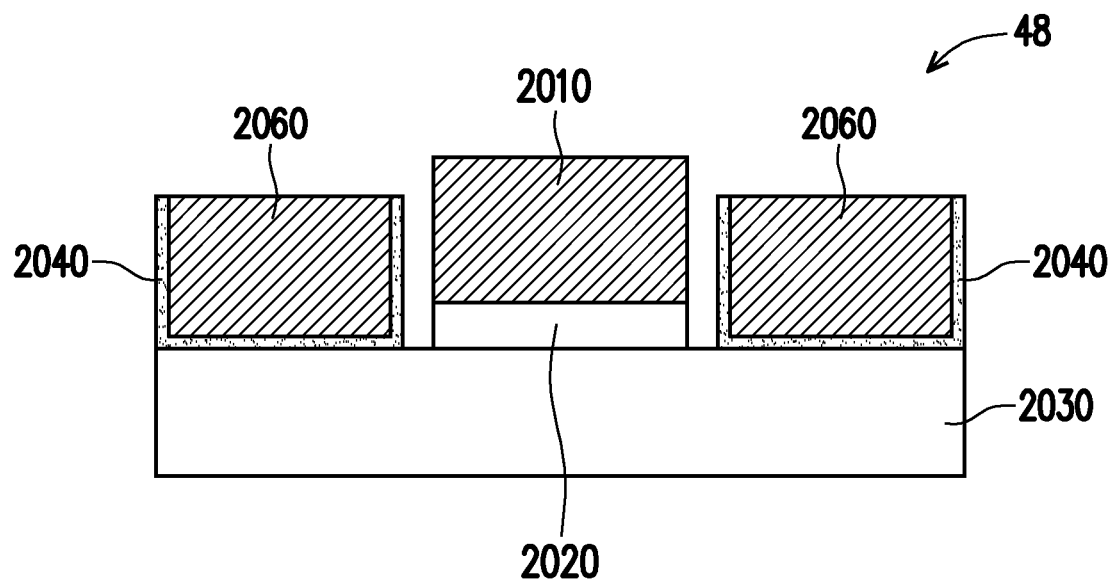
FIG. 22 and FIG. 23 are schematic cross-sectional views showing the semiconductor device in accordance with some embodiments of the disclosure.
Figure 23:
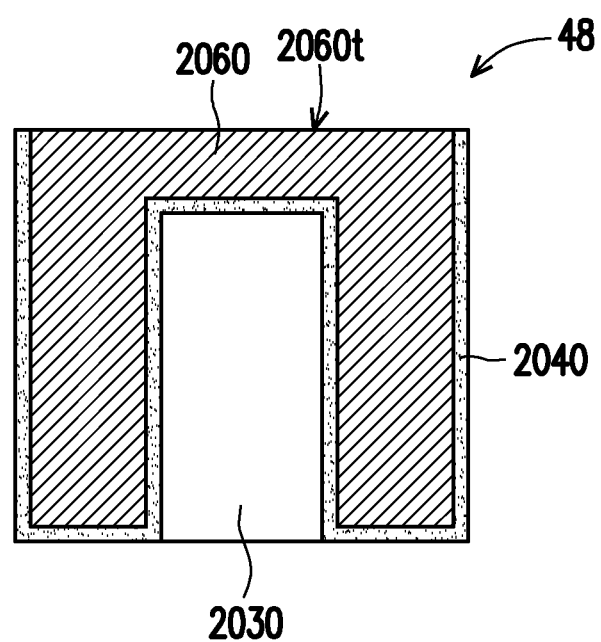

FIG. 21 is a schematic three-dimensional view showing a semiconductor device in accordance with some embodiments of the disclosure. FIG. 22 and FIG. 23 are schematic cross-sectional views respectively along the lines A-A' and B-B' showing the semiconductor device of FIG. 21 in accordance with some embodiments of the disclosure.

The structure shown in FIG. 21 is similar to but different from the structure shown in FIG. 18, and the main structural difference lies in that the location of the binary oxide layer 2040 in the semiconductor device structure 48 as shown in FIG. 21. Referring to FIG. 21 and FIG. 22, in some embodiments, the semiconductor device structure 48 includes a gate structure 2000 of a gate layer 2010 and a gate dielectric layer 2020 stacked on a semiconductor layer 2030. In some embodiments, as shown in FIG. 21, the gate structure 2000 is disposed on and surrounds the top side and the two opposite sides of the semiconductor layer 2030. From FIG. 21, the gate structure 2000 may shape like a reverse U shape wrapping around the semiconductor layer 2030. In some embodiments, the structure 48 includes source and drain terminals 2060 located on the semiconductor layer 2030 with a binary oxide layer 2040 located there-between. In some embodiments, source and drain terminals 2060 are located at two opposite sides of the gate structure 2000 and are separate from the gate structure 2000 by an interlayer dielectric (ILD) layer (not shown). In FIG. 21, FIG. 22 and FIG. 23, the ILD layer is not shown for simplicity. In some embodiments, the source and drain terminals 2060 each may shape like a reverse U shape wrapping around the semiconductor layer 2030. In FIG. 21, FIG. 22 and FIG. 23, each of the source and drain terminals 2060 is surrounded by the binary oxide layer 2040. In some embodiments, either the source terminal or the drain terminal 2060 is sheathed and surrounded by the binary oxide layer 2040, and the binary oxide layer 2040 covers the sidewalls and the bottom surfaces of the source and drain terminals 2060 without covering the top surfaces 2060t of the source and drain terminals 2060. In some embodiments, the source and drain terminals 2060 are isolated from the semiconductor layer 2030 through the binary oxide layer 2040. In some embodiments, the gate dielectric layer 2020 are in direct contact with the semiconductor layer 2030. In FIG. 23, the binary oxide layers 2040 are sandwiched between the semiconductor layer 2030 and the respective the source and drain terminals 2060.

In the exemplary embodiments, the formation of the binary oxide layer between the channel layer (e.g. semiconductor layer) and the source and drain terminals leads to lower contact resistance between the channel layer and the source and drain terminals. Overall, the performance of the semiconductor device is enhanced.

In the embodiments, the binary oxide layer and the semiconductor channel layer may be formed within the same chamber in a self-aligned way, and the binary oxide layer formed as a capping layer over the whole outer surface of the semiconductor layer can be appropriately controlled. In some embodiments, the capping binary oxide layer formed over the semiconductor layer modulates the surface characteristics of the semiconductor layer and lowers the contact resistance between the semiconductor layer and the source and drain terminals.

In other embodiments, the binary oxide layer and the semiconductor channel layer may be formed separately, and the binary oxide layer formed between the contact surfaces of the source and drain terminals and the semiconductor layer, and contact resistance between the semiconductor layer and the source and drain terminals may be reduced.

In some embodiments of the present disclosure, a semiconductor device is described. The semiconductor device has a semiconductor layer and a gate structure located on the semiconductor layer. The semiconductor device has source and drain terminals disposed on the semiconductor layer, and a binary oxide layer disposed between and interfacing the semiconductor layer and the source and drain terminals.

In some embodiments of the present disclosure, a semiconductor device is described. The semiconductor device has a semiconductor channel layer, a gate layer disposed over the semiconductor channel layer, and a gate dielectric layer disposed between the gate layer and the semiconductor channel layer. The semiconductor device has a source and a drain disposed on the semiconductor channel layer, and a binary oxide layer disposed between the semiconductor channel layer and the source and between the semiconductor channel layer and the drain.

In some embodiments of the present disclosure, a method for forming a semiconductor device is described. A semiconductor material layer and a binary oxide material layer on the semiconductor material layer are formed. The semiconductor material layer and the binary material layer are patterned into a semiconductor layer and a binary oxide layer. A gate structure is formed over the semiconductor layer and the binary oxide layer. An insulating layer is formed over the gate structure and the semiconductor layer and the binary oxide layer. Source and drain terminals are formed on the binary oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor layer;
   a gate structure disposed on the semiconductor layer;
   source and drain terminals disposed on the semiconductor layer; and
   a binary oxide layer disposed between and interfacing the semiconductor layer and the source and drain terminals, wherein the binary oxide layer surrounds the source and drain terminals and contacts bottom surfaces and sidewalls of the source and drain terminals, and the semiconductor layer is isolated from the source and drain terminals by the binary oxide layer.

2. The semiconductor device of claim 1, wherein the gate structure is located at a first side of the semiconductor layer, while the source and drain terminals are located at a second side of the semiconductor layer that is opposite to the first side.

3. The semiconductor device of claim 2, wherein the binary oxide layer extends on a top surface of the semiconductor layer and the source and drain terminals are in contact with the binary oxide layer.

4. The semiconductor device of claim 2, wherein the binary oxide layer includes gallium oxide, indium oxide, zinc oxide, titanium oxide, aluminum oxide, a mixture thereof, or a combination thereof.

5. The semiconductor device of claim 1, wherein the gate structure and the source and drain terminals are located at a same side of the semiconductor layer, and the source and drain terminals are located at two opposite sides of the gate structure.

6. The semiconductor device of claim 5, wherein the binary oxide layer extends on a top surface of the semiconductor layer and the source and drain terminals are in contact with the binary oxide layer.

7. The semiconductor device of claim 5, wherein the binary oxide layer includes gallium oxide, indium oxide, zinc oxide, titanium oxide, aluminum oxide, a mixture thereof, or a combination thereof.

8. The semiconductor device of claim 1, wherein the source and drain terminals are located at two opposite sides of the gate structure, and the gate structure and the source and drain terminals surround the semiconductor layer.

9. The semiconductor device of claim 8, wherein the binary oxide layer extends over three sides of the semiconductor layer and the source and drain terminals are in contact with the binary oxide layer.

10. The semiconductor device of claim 8, wherein the binary oxide layer wraps and contacts bottom surfaces and sidewalls of the source and drain terminals and exposes top surfaces of the source and drain terminals.

11. A semiconductor device, comprising:
a semiconductor channel layer;
a gate layer disposed over the semiconductor channel layer;
a gate dielectric layer disposed between the gate layer and the semiconductor channel layer;
a source and a drain disposed on the semiconductor channel layer; and
a binary oxide layer sandwiched between the semiconductor channel layer and the source and the drain.

12. The semiconductor device of claim 11, wherein a material of the binary oxide layer includes gallium oxide, indium oxide, zinc oxide, titanium oxide, aluminum oxide, a mixture thereof, or a combination thereof.

13. The semiconductor device of claim 12, wherein the binary oxide layer extends on a top surface of the semiconductor channel layer.

14. The semiconductor device of claim 12, wherein the binary oxide layer surrounds the source and the drain and contacts bottom surfaces and sidewalls of the source and the drain.

15. The semiconductor device of claim 12, wherein the binary oxide layer extends over and contacts three sides of the semiconductor channel layer.

16. A method of manufacturing a semiconductor device, comprising:
forming a semiconductor material layer and forming a binary oxide material layer on the semiconductor material layer;
patterning the semiconductor material layer and the binary material layer into a semiconductor layer and a binary oxide layer;
forming a gate structure over the semiconductor layer and the binary oxide layer;
forming an insulating layer over the gate structure and the semiconductor layer and the binary oxide layer; and
forming source and drain terminals on the binary oxide layer.

17. The method of claim 16, further comprising forming contact openings in the insulating layer exposing the binary oxide layer before forming the source and drain terminals.

18. The method of claim 16, wherein the semiconductor material layer and the binary oxide layer are formed continuously in a same deposition process.

19. The method of claim 16, wherein the binary oxide material layer is blanketly formed over the semiconductor material layer and the binary oxide material layer covers a top surface of the semiconductor material layer.

20. The method of claim 16, wherein the binary oxide material layer is blanketly formed over the semiconductor material layer and the binary oxide material layer covers a top surface and two opposite sidewalls of the semiconductor material layer.

* * * * *